United States Patent
Sasaki (10) Patent No.: US 7,952,186 B2
(45) Date of Patent: May 31, 2011

(54) SEMICONDUCTOR PACKAGE LAND GRID ARRAY SUBSTRATE AND PLURALITY OF FIRST AND SECOND ELECTRODES

(75) Inventor: Kou Sasaki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 599 days.

(21) Appl. No.: 12/071,043

(22) Filed: Feb. 14, 2008

(65) Prior Publication Data

US 2008/0231288 A1 Sep. 25, 2008

(30) Foreign Application Priority Data

Mar. 19, 2007 (JP) ................................. 2007-070417

(51) Int. Cl.
*H01L 23/498* (2006.01)
*G01R 31/04* (2006.01)
(52) U.S. Cl. ................ 257/692; 257/E23.061; 257/786; 257/784; 257/668; 257/680; 257/684; 324/538
(58) Field of Classification Search .................. 257/692, 257/E23.061, 786, 784, 668, 680, 684; 324/538
See application file for complete search history.

(56) References Cited

U.S. PATENT DOCUMENTS

2005/0017740 A1 * 1/2005 Higashitani et al. .......... 324/751
2007/0108583 A1 * 5/2007 Shim et al. .................... 257/686

FOREIGN PATENT DOCUMENTS

| JP | 60-200537 | 10/1985 |
| JP | 2001-217054 | 8/2001 |
| JP | 2005-302871 | 10/2005 |
| JP | 2008-235434 | * 10/2008 |

* cited by examiner

*Primary Examiner* — Alexander O Williams
(74) *Attorney, Agent, or Firm* — McGinn IP Law Group, PLLC

(57) ABSTRACT

A semiconductor package includes a bare chip which has a plurality of external electrodes, a land grid array substrate having an edge, a first surface and a second surface. The first surface includes a first portion apart from the edge and a second portion adjacent to the edge. The first portion of the first surface mounts the bare chip and is covered with a resin to seal the bare chip with the resin. The first portion of the first surface and the second surface includes a non-sealed region which is not covered with the resin. A plurality of first electrodes are arranged on the non-sealed region and connected to the external electrodes and a plurality of second electrodes are arranged on the second surface and connected to the external electrodes.

8 Claims, 6 Drawing Sheets

Figure 10

SEMICONDUCTOR PACKAGE LAND GRID ARRAY SUBSTRATE AND PLURALITY OF FIRST AND SECOND ELECTRODES

BACKGROUND OF THE INVENTION

1. Field of the Invention

The present invention relates to a semiconductor package, and more particularly, to an LGA (Land Grid Array) package.

2. Description of Related Art

As for LGA (Land Grid Array) packages, a plurality of LSI (Large Scale Integration) packages, for example, SIMM (Single Inline Memory Module) or DIMM (Double Inline Memory Module) on which a memory package is mounted, are mounted side by side on a module substrate.

Such a semiconductor package is described in Patent Document 1 (Japanese Patent Laid-Open No. 2005-302871).

The document describes testing bonding pads arranged along substrate edges on a chip mounting surface of a BGA substrate. One edge along which the bonding pads are arranged is inserted into a socket of a testing apparatus and tested. After the testing, the bonding pads are wire-bonded with electrode pads of the chip and sealed with resin.

Patent Document 2 (Japanese Patent Laid-Open No. 2001-217054) describes a socket connected to a terminal of an LGA type package.

Though the technical field is different, Patent Document 3 (Japanese Patent Laid-Open No. 60-200537) describes a semiconductor apparatus provided with a test terminal. The apparatus described in the document includes actually used leads arranged in a perimeter of a pin grid array substrate and a lead-less test-only terminal is provided therein.

Figure 9:
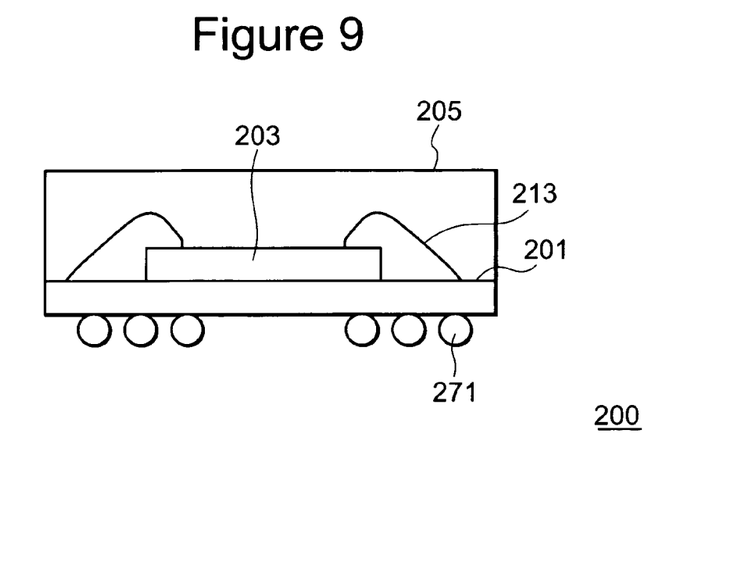
FIG. 9 is a cross-sectional view showing the configuration of the package.
Figure 10:
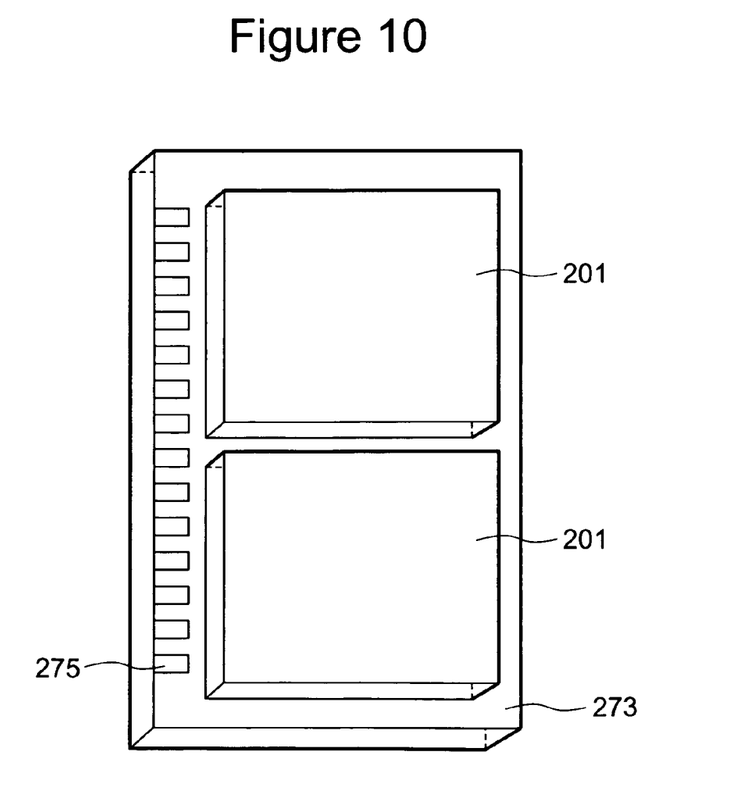
FIG. 10 is a perspective view showing the configuration of a module having the package shown in FIG. 9.

However, when connected to a socket or the like for use, such semiconductors package must be mounted on a module substrate once. This will be explained with reference to FIG. 9 and FIG. 10. FIG. 9 is a cross-sectional view showing the configuration of the package and FIG. 10 is a perspective view showing the configuration of a module including the package shown in FIG. 9.

In an LGA package 200 shown in FIG. 9, a bare chip 203 is mounted on an LGA substrate 201 and the bare chip 203 and a bonding wire 213 are sealed with sealing resin 205. The sealing resin 205 covers the whole chip mounting surface of the LGA substrate 201. Furthermore, a plurality of solder balls 271 are provided on the back of the LGA substrate 201. In the package shown in FIG. 9, the electrodes which function as externally connected terminals are the solder balls 271. When the user connects the LGA package 200 to a socket, as shown in FIG. 10, the LGA package 200 must be mounted on a module substrate 273 having a connector electrode 275. This would increase the size of the overall apparatus after mounting. Furthermore, when the user mounts the semiconductor package on the module substrate, the mounting takes time and trouble and there is also concern that mounting failures may occur.

Furthermore, in the case of the package described in Patent Document 1, the testing bonding pad is sealed after testing. Therefore, after sealing and mounting the package on the module substrate, the use can not make a test equivalent to a test performed before sealing.

SUMMARY OF THE INVENTION

Regarding one exemplary aspect of the present invention, a semiconductor package includes a bare chip that has a plurality of external electrodes, a land grid array substrate having an edge, a first surface and a second surface. The first surface includes a first portion apart from the edge and a second portion adjacent to the edge. The first portion of the first surface mounts the bare chip and is covered with a resin to seal the bare chip with the resin. The first portion of the first surface and the second surface includes a non-sealed region which is not covered with the resin. A plurality of first electrodes are arranged on the non-sealed region and connected to the external electrodes and a plurality of second electrodes are arranged on the second surface and connected to the external electrodes.

According to the aspect, a non-sealed region is selectively provided in a region including a potion along sides of the land grid array substrate on which the bare chip is mounted. The first electrode is applicable to function as an electrode for actual use. This configuration allows the non-sealed region of the land grid array substrate to be used as an externally connected region just as is. This eliminates the necessity for a step of mounting the semiconductor package on the module substrate and makes it possible to reduce the size of the overall apparatus. Furthermore, since the user need not mount the semiconductor package on the module substrate before use, the apparatus can be easily used and can also reduce mounting failures.

Furthermore, one exemplary aspect of the present invention provides a plurality of second electrodes which function as inspection lands on the other surface of the land grid array substrate. With the inspection lands provided on the other surface of the land grid array substrate having no sealing resin, it has a structure which allows a bare chip or package manufacturer or the like to easily inspect the operation of the bare chip after sealing.

As described above, the present invention secures terminals in actual use and can provide a semiconductor package that eliminates the necessity for mounting by a customer on the substrate.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Embodiment

Figure 1:
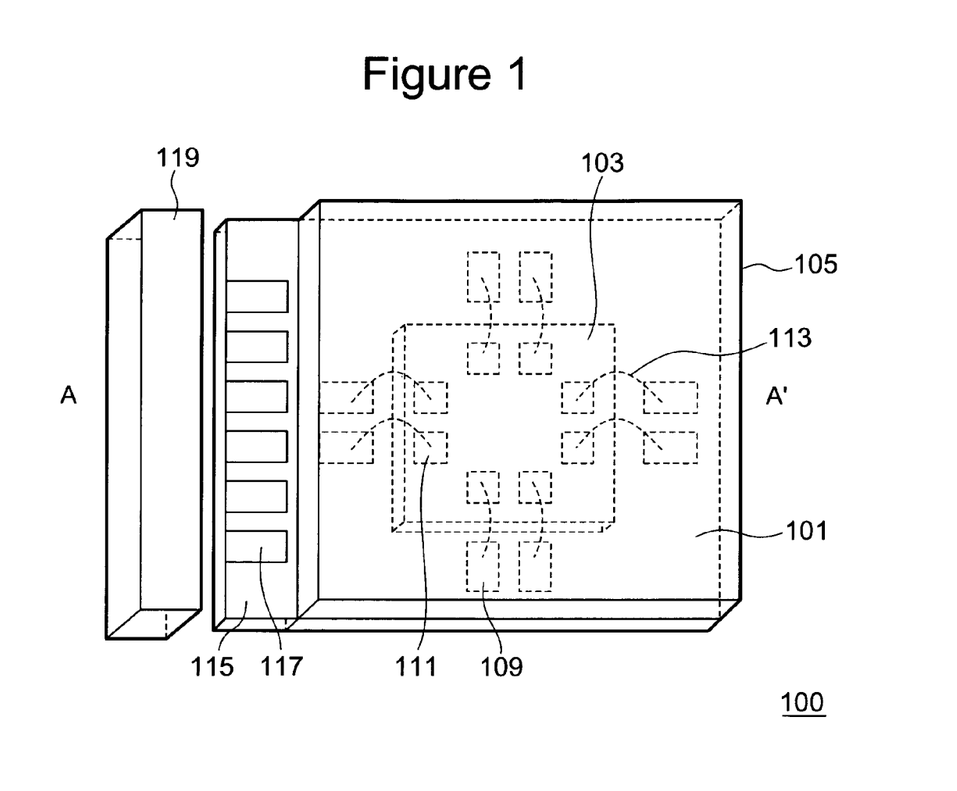
FIG. 1 is a perspective view showing a semiconductor package according to this embodiment.
Figure 2:
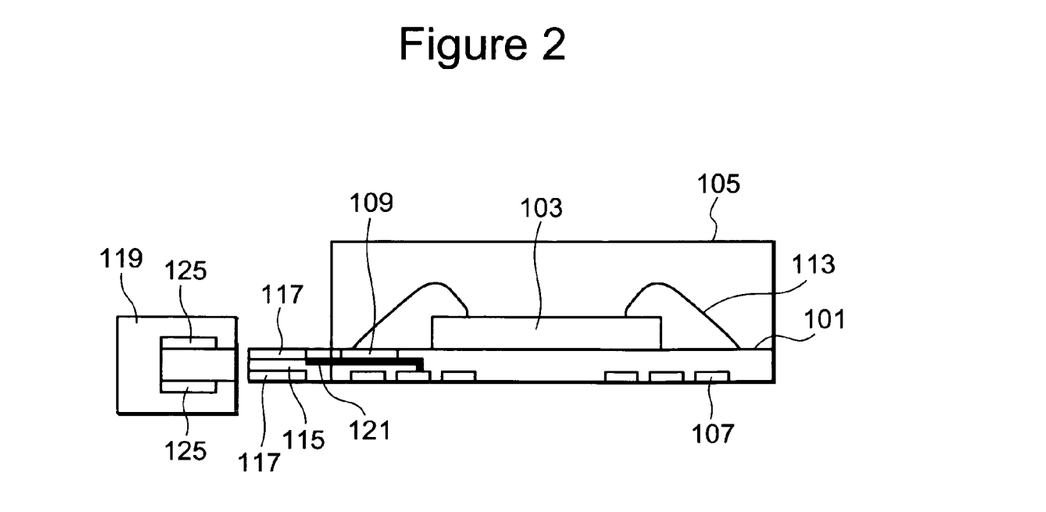
FIG. 2 is an A-A' cross-sectional view of FIG. 1.

FIG. 1 is a perspective view showing a semiconductor package in this embodiment and FIG. 2 is an A-A' cross-sectional view of FIG. 1. Furthermore, FIG. 3 is a plan view showing the back of the LGA substrate 101 of the semiconductor package shown in FIG. 1.

Figure 3:
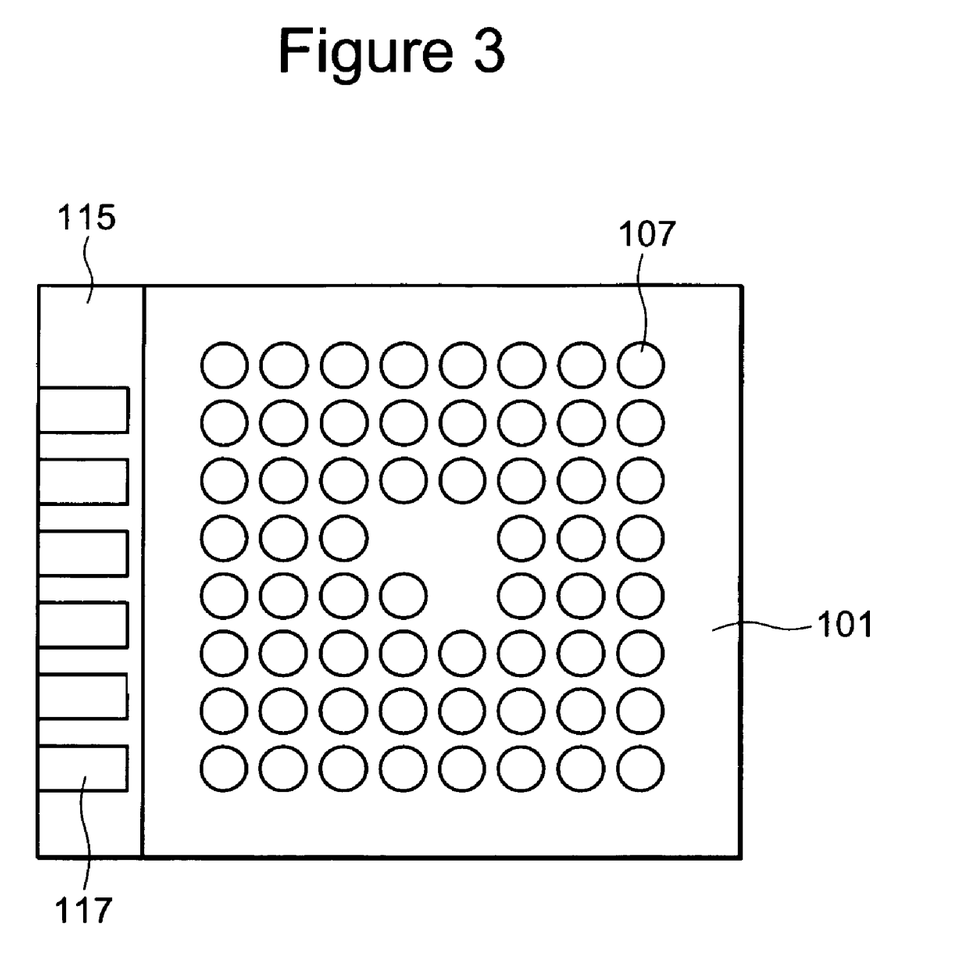
FIG. 3 is a plan view showing the back of the LGA substrate of the semiconductor package shown in FIG. 1.

The semiconductor package (LGA package 100) shown in FIG. 1 to FIG. 3 includes a bare chip 103 provided with a plurality of externally connected electrodes (electrode pads 111), an LGA substrate (printed wire board) 101, on one surface (chip mounting surface) of which the bare chip 103 is mounted and a sealing resin 105 provided on a chip mounting surface of the LGA substrate 101. It is noted that the FIG. 1 shows the single bare chip, but a plurality of bare chip may be provided on the printed wire board to constitute a system in package (SIP).

The sealing resin 105 covers part of the chip mounting surface of the LGA substrate 101 and also seals the bare chip 103.

The LGA substrate 101 has a planar shape having sides, or more specifically a rectangular shape and is constructed of a sealed region, when viewed from above the chip mounting surface, covered with the sealing resin 105 and a non-sealed region not covered with the sealing resin 105. The non-sealed region is a region which includes one side of the rectangle and is selectively provided along the side. The width (A-A' direction) of the connection region 115 made up of the non-sealed region is not particularly limited and any degree of width which will cause no problem with the connection with a socket 119, which will be described later, is acceptable. It is noted that, though the socket 119 in FIG. 1 is not shown an insert portion to insert the electrodes 117 due to the view point, the inset portion is actually provided as shown in FIG. 2.

The LGA substrate 101 is provided with first electrodes (user electrodes 117) connected to the land 109 of the bare chip 103 in the non-sealed region and a plurality of second electrodes (testing lands 107) are provided on the other surface (back) of the LGA substrate 101 in the sealed region.

When viewed from the back of the LGA substrate 101, the user electrodes 117 and testing lands 107 are lands having different planar shapes and no lead electrode or bump electrode is connected to any of them. Furthermore, as for the LGA package 100, the number of testing lands 107 is larger than the number of user electrodes 117.

Here, the user electrode 117 functions as terminals used by the user of the LGA package 100 for external connection. In the LGA package 100, the non-sealed region of the LGA substrate 101 serves as the connection region 115 for external connection and the connection region 115 is inserted into the socket 119. The width and depth of the stripe-shaped recessed part of the socket 119 correspond to the thickness of the LGA substrate 101 in the connection region 115 and the width of the connection region 115 respectively. Electrodes 125 are provided at positions corresponding to the respective user electrodes 117 on the inner surfaces of the socket 119. When the connection region 115 is inserted into the socket 119, the plurality of user electrodes 117 arranged on both sides of the connection region 115 contact the different electrodes 125 respectively. This causes the electrode pads 111 provided on the bare chip 103 to become connector electrodes, which are then connected to the electrodes 125 outside the package through the bonding wire 113, lands 109, wiring 121 and user electrodes 117.

Each user electrode 117 is connected to any one of the plurality of electrode pads 111. The LGA package 100 may be provided with the user electrodes 117 corresponding to all the electrode pads 111 or provided with only the user electrodes 117 connected to some of the electrode pads 111.

Furthermore, the testing lands 107 function as terminals for inspecting the package and used, for example, by the manufacturer of the bare chip 103 or LGA package 100. The testing lands 107 are arranged in the sealed region in a shape like tetragonal lattice on the back of the LGA substrate 101. More specifically, the number of testing lands 107 is greater than the number of electrode pads 111 provided on the bare chip 103. Each of the plurality of testing lands 107 is connected to any one of the plurality of electrode pads 111 and the corresponding testing lands 107 are provided for all the electrode pads 111. In this embodiment, all the lands shown in FIG. 3 are testing lands 107.

Furthermore, the plurality of lands 109 are provided in the sealed region along outer edges of the bare chip 103 on the chip mounting surface of the LGA substrate 101. The electrode pads 111 of the bare chip 103 and the lands 109 of the LGA substrate 101 are connected together by the bonding wires 113.

Next, the manufacturing method of the LGA package 100 will be explained.

First, the bare chip 103 and the LGA substrate 101 are prepared. The bare chip 103 is, for example, a memory chip having a rectangular planar shape and the electrode pads 111 are arranged along the sides of the rectangle.

Furthermore, a predetermined number of user electrodes 117 are formed at predetermined positions of the region which becomes the connection region 115 in the LGA substrate 101. Furthermore, the lands 109 are formed on the chip mounting surface in the region which becomes the sealed region and the testing lands 107 are formed on the back. Furthermore, wiring 121 for connecting the lands 109 and the electrode pads 111 or testing lands 107 is formed.

The bare chip 103 is mounted on the chip mounting surface of the LGA substrate 101, the lands 109 and the electrode pads 111 are wire-bonded using the bonding wire 113 and the region other than the connection region 115 is sealed with the sealing resin 105. The LGA package 100 shown in FIG. 1 to FIG. 3 is obtained through the above described procedure.

Next, operations and effects of this embodiment will be explained.

In this embodiment, the edge region along one side of the LGA substrate 101 is not sealed and serves as the connection region 115 for external connection. By providing the connection region 115 including one side of the LGA substrate 101 and near the one side, it is possible to use the LGA substrate 101 directly inserted into the socket 119 in the connection region 115. This eliminates the necessity for the step in which the user mounts the LGA package 100 on the module substrate before use.

Furthermore, this also eliminates the necessity for remounting the bare chip 103 on the module substrate, and thereby allows the overall package size and thickness to be reduced. Moreover, since no mounting process is necessary, no mounting failure is produced. Furthermore, since the heating process during mounting, for example, a heating process in solder mounting is not necessary, a configuration suitable for reuse of the bare chip 103 is provided.

Furthermore, this embodiment provides the testing lands 107 to be connected to each bare chip 103 on the back of the LGA substrate 101 in addition to the user electrodes 117. For this reason, the manufacturer or the like of the bare chip 103 or LGA package 100 can easily inspect the operation of the bare chip 103 after sealing using the testing lands 107. Furthermore, a nondestructive inspection can be conducted in a condition equivalent to that before sealing while keeping the bare chip 103 sealed.

In this way, this embodiment is applicable to both actual use by the user and inspection by the manufacturer or the like, can be used just as is without being remounted or decomposed in doing so and can provide a small and thin package structure. These operations and effects are especially outstanding in a memory package with many testing terminals (testing lands 107) and fewer user terminals (user electrodes 117).

Furthermore, in the connection region 115 of the LGA package 100, the user electrodes 117 are exposed from the chip mounting surface of the LGA substrate 101 or from the back to the side and designed to be inserted from the side of the LGA substrate 101 into the socket 119. For this reason, the LGA package 100 allows the LGA substrate 101 to be connected to a set substrate having the socket 119 such as SIMM and DIMM at 90 degrees. Adopting such a connection mode causes the wiring of the set substrate to be directed in the thickness direction, and can thereby reduce the resistance and capacitance components compared to a case where the set substrate and the LGA package 100 are arranged side by side.

Hereinafter, explanations will be focused on the differences from the first embodiment.

Second Embodiment

In the first embodiment, the number and arrangement of the electrode pads 111, user electrodes 117 and testing lands 107 can also be set as follows.

Figure 4A:
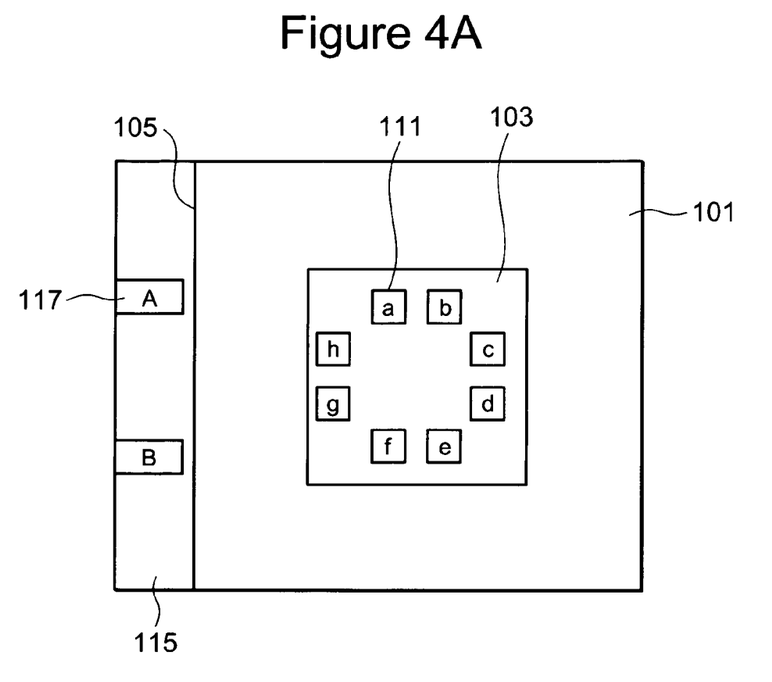
FIG. 4A to 4B is a plan view showing the configuration of the LGA package of this embodiment.
Figure 4B:
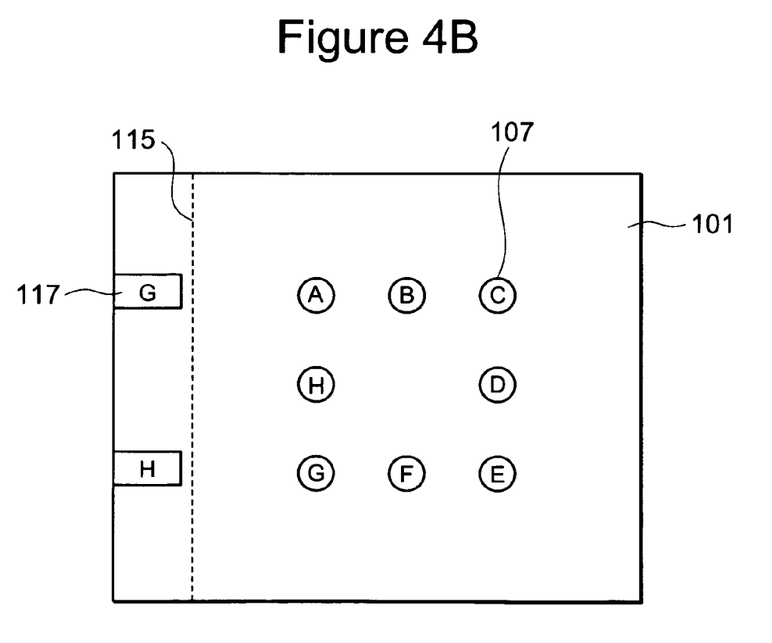

FIG. 4A and FIG. 4B are plan views showing the configuration of an LGA package according to this embodiment. FIG. 4A shows a chip mounting surface of the package and FIG. 4B shows the back.

The LGA package shown in FIG. 4A and FIG. 4B is provided with the same number of testing lands 107 as electrode pads 111 and the same number of user electrodes 117 as some of the plurality of electrode pads 111.

More specifically, the LGA package shown in FIG. 4A and FIG. 4B has eight electrode pads a to h as the electrode pads 111.

Furthermore, this package has A, B, G and H as the user electrodes 117 to be connected to a, b, g and h of the electrode pads 111 respectively. In a connection region 115, A and B of the user electrodes 117 are provided on the chip mounting surface of the LGA substrate 101 and G and H are provided on the back thereof.

Furthermore, this package has the testing lands 107 (A to H) corresponding to a to h of the electrode pads 111 on the back of the LGA substrate 101.

Furthermore, the example where the user electrodes 117 are provided in the connection region 115 on both sides of the LGA substrate 101 has been explained so far, but the user electrodes 117 may also be provided in the connection region 115 on only one side of the LGA substrate 101.

These packages can also obtain operations and effects similar to those of the first embodiment.

Figure 5:
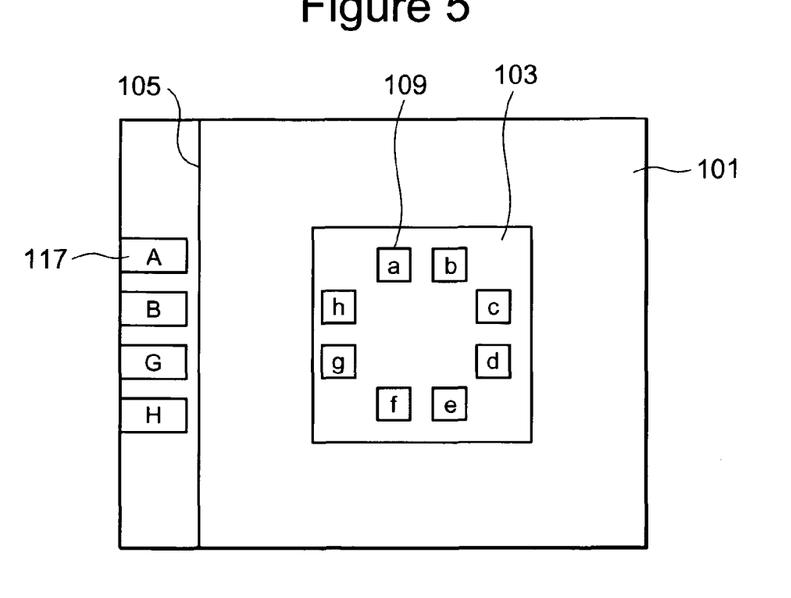
FIG. 5 is a plan view showing the configuration of the LGA package of this embodiment.

FIG. 5 shows the configuration of such an LGA package and shows the chip mounting surface side. The basic configuration of the LGA package shown in FIG. 5 is similar to that shown in FIG. 4(a) and FIG. 4(b), but it is different in that all the user electrodes 117 (A, B, G, H) are provided on the chip mounting surface.

Third Embodiment

Figure 6:
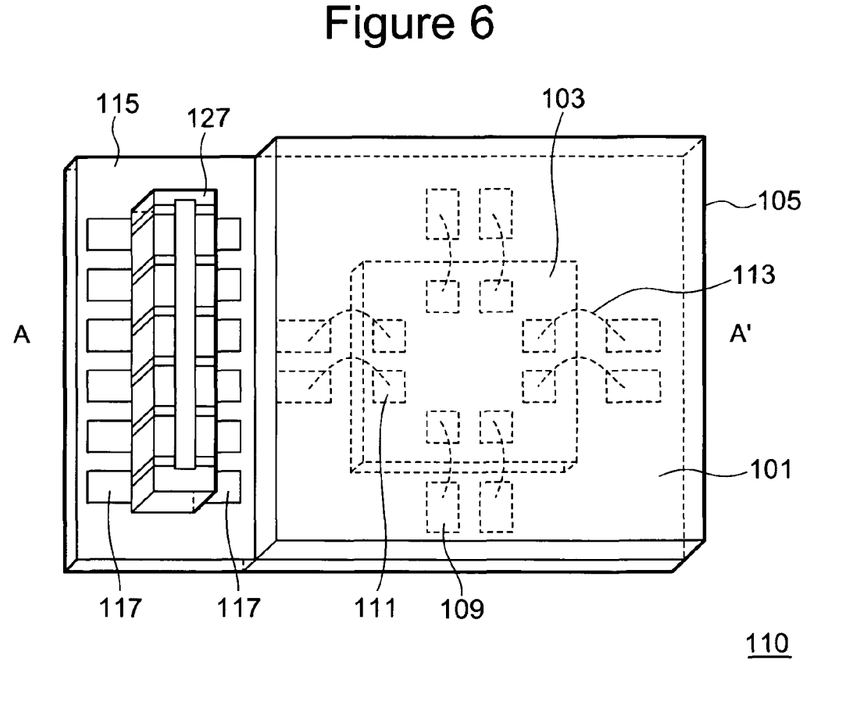
FIG. 6 is a perspective view showing the configuration of the LGA package of this embodiment.
Figure 7:
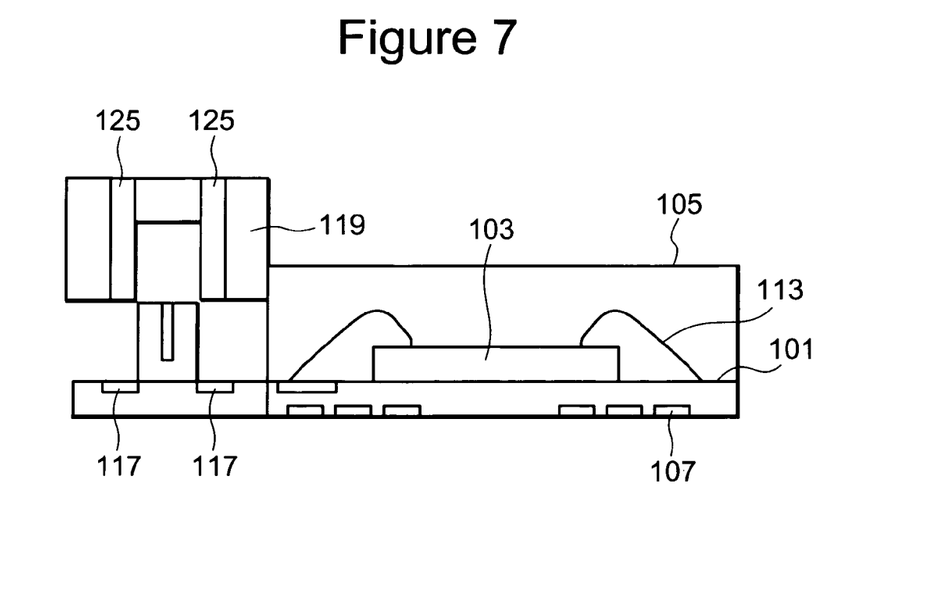
FIG. 7 is an A-A' cross-sectional view of FIG. 6.

FIG. 6 is a perspective view showing the semiconductor package in this embodiment, FIG. 7 is an A-A' cross-sectional view of FIG. 6 and shows a socket connected to the semiconductor package shown in FIG. 6. Furthermore, FIG. 8 is a plan view showing the back of an LGA substrate 101 of the semiconductor package shown in FIG. 6.

Figure 8:
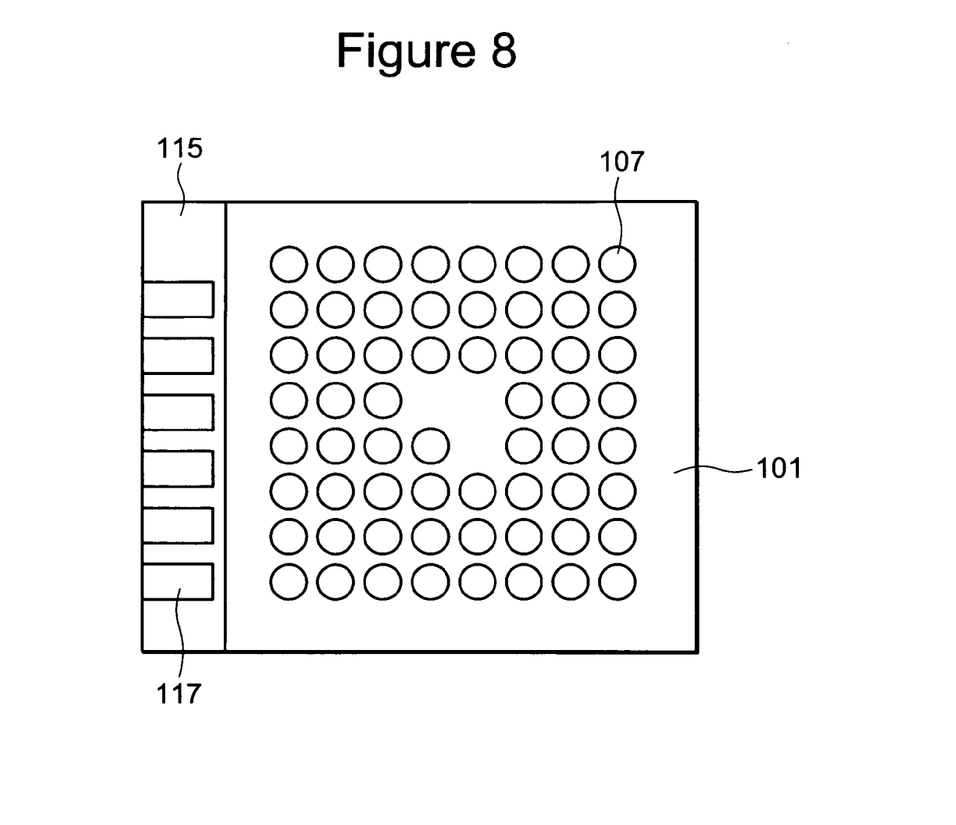
FIG. 8 is a plan view showing the back of the LGA substrate of the semiconductor package shown in FIG. 6.

The basic configuration of the LGA package 110 shown in FIG. 6 to FIG. 8 is similar to that of the LGA package 100 (FIG. 1 to FIG. 3), but differs in the structure of a connection region 115.

More specifically, in the LGA package 110, a connector (connector section 127) is formed on the chip mounting surface of the LGA substrate 101 in a non-sealed region of the LGA substrate 101 and configured so that a recessed part of a socket 119 engages with the connector section 127.

This embodiment also uses one side of the LGA substrate 101 and the neighborhood thereof as a connection region 115 and provides testing lands 107 on the back of the LGA substrate 101 in a non-sealed region. Therefore, this embodiment has operations and effects similar to those of the first embodiment.

Furthermore, this embodiment provides sealing resin 105 and the connector section 127 on the same side. This allows the thickness of the connector section 127 to be included in the mold thickness when connected to the set substrate having the socket 119, and it is thereby possible to reduce the thickness when connected to the set substrate by an amount corresponding to the thickness of the mold compared to the case where the connector section 127 and user electrode 117 are provided on the back of the LGA substrate 101.

The embodiments of the present invention have been explained so far with reference to the drawings, but these are only examples and various configurations other than those described above can also be adopted.

Further, it is noted that, Applicant's intent is to encompass equivalents of all claim elements, even if amended later during prosecution.

What is claimed is:

1. A semiconductor package, comprising:
    at least one bare chip comprising a plurality of external electrodes;
    a land grid array substrate having an edge, a first surface and a second surface, said first surface including a first portion apart from said edge and a second portion adjacent to said edge, said first portion of said first surface mounting said bare chip and covered with a resin to seal said bare chip with said resin, said second portion of said first surface and said second surface including a non-sealed region which is uncovered with said resin;
    a plurality of first electrodes arranged on said non-sealed region and connected to said external electrodes; and
    a plurality of second electrodes arranged on said second surface and connected to said external electrodes,
    wherein said first electrodes are arranged on said second portion of said first surface, and
    wherein said first electrodes are arranged on a portion of said second surface corresponding to said first portion of said first surface for connecting a socket with said first electrodes of said first and second surfaces.

2. A semiconductor package, comprising:
    at least one bare chip comprising a plurality of external electrodes;
    a land grid array substrate having an edge, a first surface and a second surface, said first surface including a first portion apart from said edge and a second portion adjacent to said edge, said first portion of said first surface mounting said bare chip and covered with a resin to seal said bare chip with said resin, said second portion of said first surface and said second surface including a non-sealed region which is uncovered with said resin;

a plurality of first electrodes arranged on said non-sealed region and connected to said external electrodes;
a plurality of second electrodes arranged on said second surface and connected to said external electrodes,
wherein said first electrodes are arranged on said second portion of said first surface; and
a connector formed on said first portion of said first surface, for connecting to a socket.

3. The semiconductor package as claimed in claim 1, wherein said plurality of second electrodes comprise inspection lands.

4. The semiconductor package as claimed in claim 1, wherein a number of said plurality of said second electrodes is the same as said plurality of said external electrodes, and a number of said plurality of said first electrodes is less than the number of said plurality of said external electrodes.

5. The semiconductor package as claimed in claim 4, wherein some electrodes of said first electrodes are provided on said first surface and others of said first electrodes are provided on said second surface.

6. The semiconductor package as claimed in claim 4, wherein said first electrodes are provided only on said first surface.

7. A semiconductor package, comprising:
at least one bare chip comprising a plurality of external electrodes;
a land grid array substrate having an edge, a first surface and a second surface, said first surface including a first portion apart from said edge and a second portion adjacent to said edge, said first portion of said first surface mounting said bare chip and covered with a resin to seal said bare chip with said resin, said second portion of said first surface and said second surface including a non-sealed region which is uncovered with said resin;
a plurality of first electrodes arranged on said non-sealed region and connected to said external electrodes; and
a plurality of second electrodes arranged on said second surface and connected to said external electrodes,
wherein said edge comprises a first edge, said land grid array substrate comprises said first edge and a second edge, and said second edge of said land grid array substrate is aligned with a corresponding one of edges of said resin.

8. The semiconductor package as claimed in claim 7, wherein said land grid array substrate further comprises third and fourth edges aligned with corresponding ones of said edges of said resin.

* * * * *